United States Patent [19]

Shepard, Jr. et al.

[11] Patent Number: 5,821,492

[45] Date of Patent: Oct. 13, 1998

[54] RADIATION AND REGENERATIVELY COOLED ARC JET DEVICE FOR THIN DIAMOND FILM DEPOSITION

[75] Inventors: Cecil Benjamin Shepard, Jr., Laguna Niguel; Michael Scott Heuser, Foothill Ranch, both of Calif.

[73] Assignee: Celestech, Inc., Calif.

[21] Appl. No.: 800,274

[22] Filed: Feb. 14, 1997

[51] Int. Cl.[6] .................................................. H05B 7/18
[52] U.S. Cl. ................................ 219/121.11; 219/76.15; 219/383
[58] Field of Search ........................... 219/121.11, 123, 219/383, 76.15; 427/540

[56] References Cited

U.S. PATENT DOCUMENTS

| | | | |
|---|---|---|---|
| 3,497,765 | 2/1970 | Hammer | 219/121.11 |
| 3,512,029 | 5/1970 | Kienast et al. | 219/121.11 |
| 3,707,644 | 12/1972 | Hirt et al. | 219/121.11 |
| 3,891,828 | 6/1975 | Corso | 219/123 |
| 3,953,705 | 4/1976 | Painter | 219/121.11 |
| 4,535,225 | 8/1985 | Wolf et al. | 219/123 |

*Primary Examiner*—Clifford C. Shaw
*Attorney, Agent, or Firm*—H. Jay Spiegel

[57] ABSTRACT

A radiation and regeneratively cooled arc jet device includes improvements designed to provide higher gas enthalpy operation for thin diamond film deposition. A series of circumferentially and axially spaced gas injection holes are provided in the cylindrical inner walls of the arc chamber between a cathode and anode. This arc chamber wall is fabricated from a material having a high thermal shock parameter. The ratio of the spacing of the injection holes within each row as compared to the chamber diameter is set within a specific range. In the circumferential direction, a multiplicity of axial rows of holes are provided and spaced equally about the circumference of the chamber. The annular anode is isolated at the open end of the arc chamber by an insulator having a high thermal shock parameter, to conduct anticipated heat loads without mechanical failure.

23 Claims, 5 Drawing Sheets

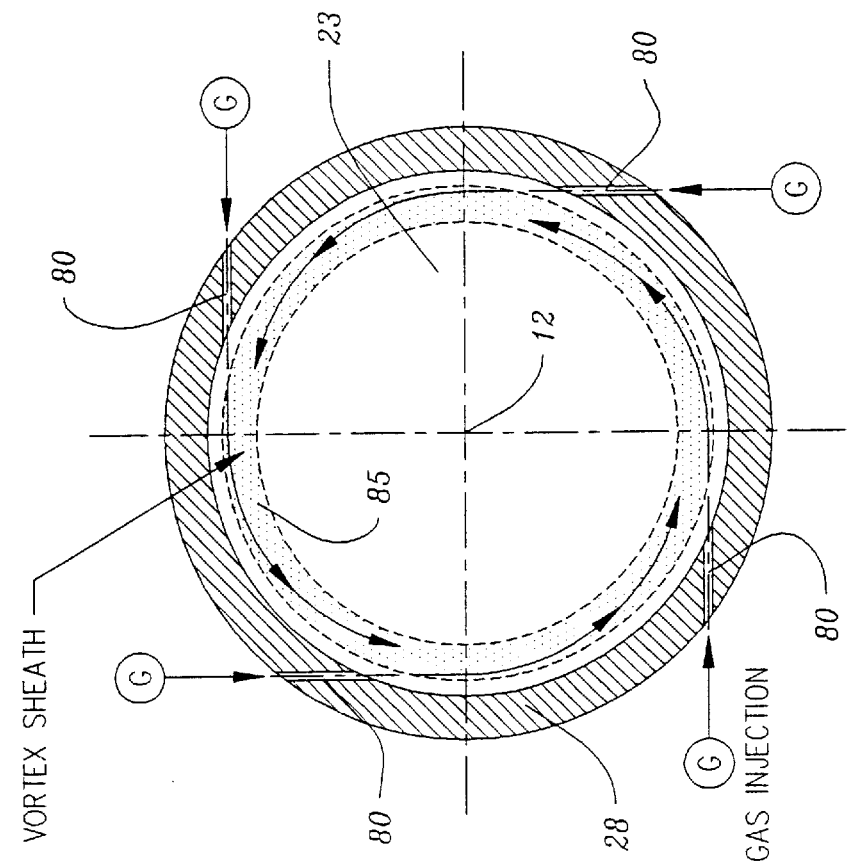
Figure 4 (4) ROWS @ 90° SPACING
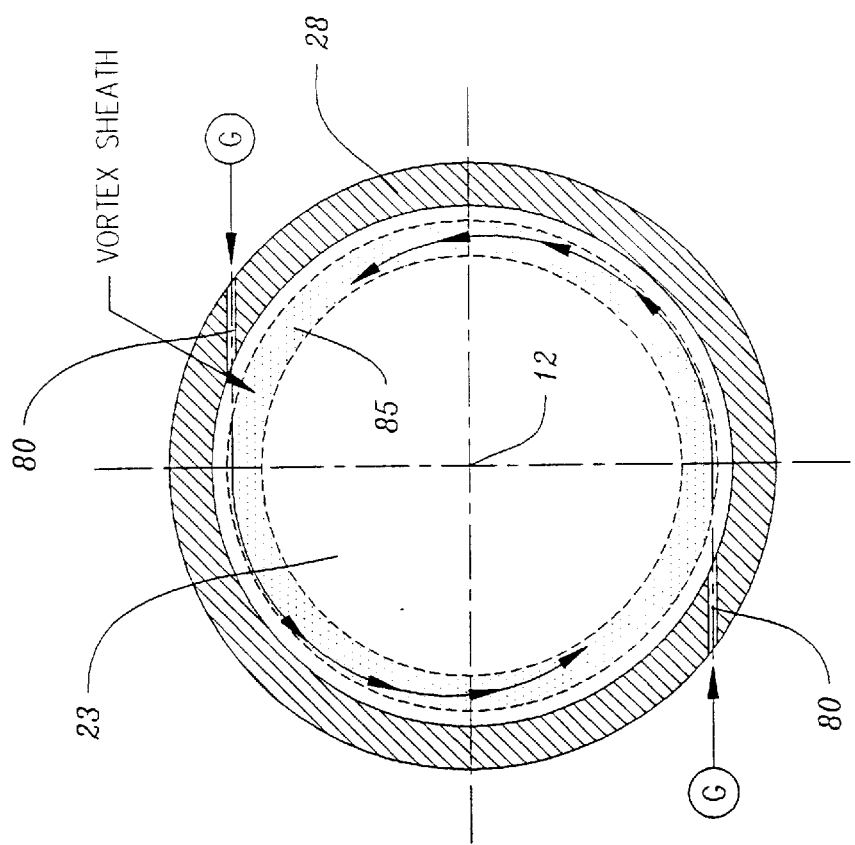
Figure 3 (2) ROWS @ 180° SPACING

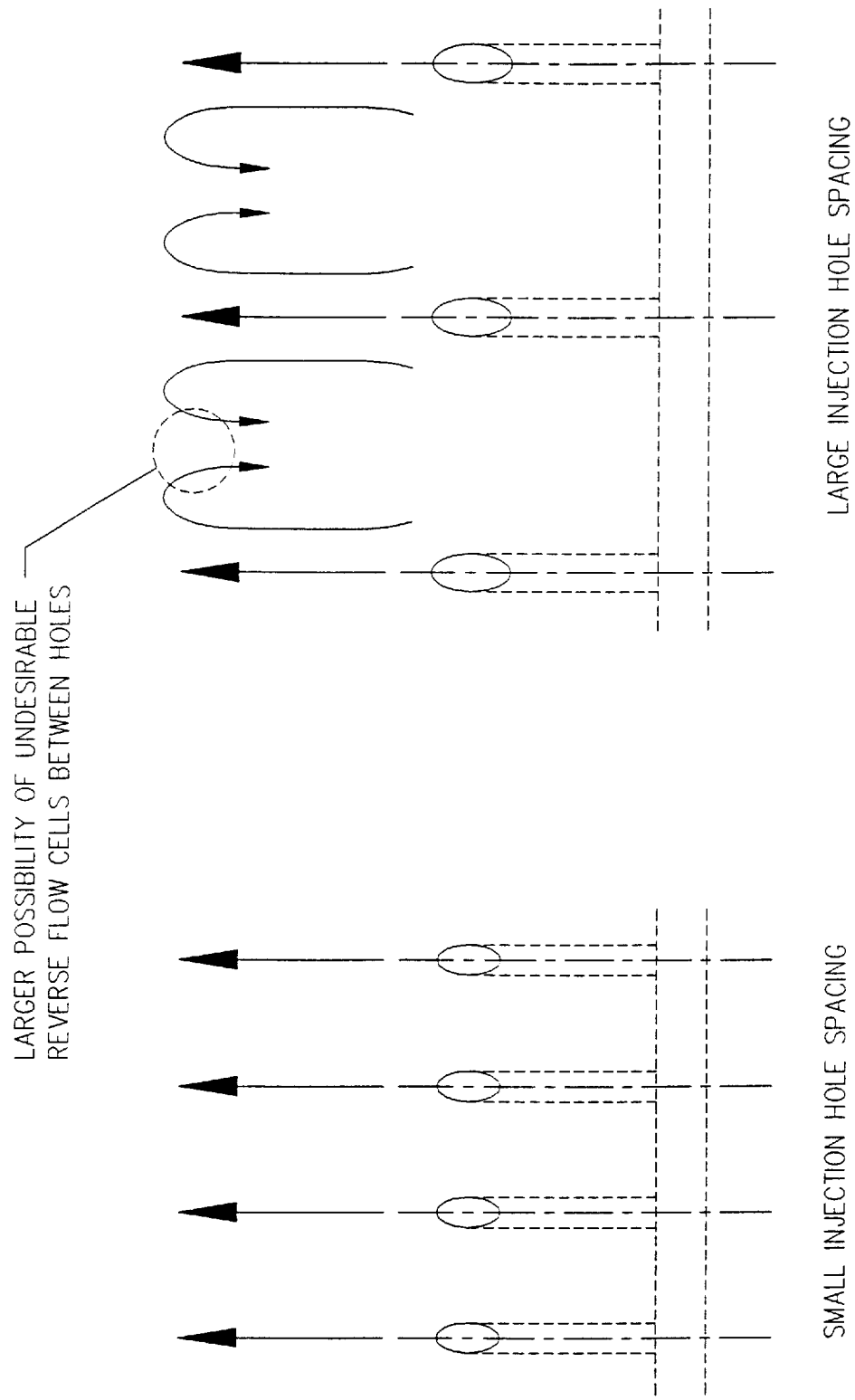

RADIATION AND REGENERATIVELY COOLED ARC JET DEVICE FOR THIN DIAMOND FILM DEPOSITION

BACKGROUND OF THE INVENTION

The present invention relates to improvements to radiation and regeneratively cooled arc jet devices for thin diamond film deposition. In particular, the inventive improvements facilitate higher gas enthalpy operation. Some early arc jet devices utilized arc chamber wall designs that consisted of alternating rings of insulative material such as Transite, glass composite or, boron nitride and conductive materials such as graphite or refractory-grade metal or water-cooled copper. One purpose for the use of such a stack of alternating materials was to divide the total arc voltage existing between the cathode and the anode among the total number of conductive segments, thus lowering the voltage between each pair of adjacent segments to a magnitude that was less likely to sustain or enhance spurious arcing between adjacent conductive segments.

In the prior art, a gas such as argon, helium, hydrogen or nitrogen was injected into the arc chamber via one or a few holes of either circular or rectangular cross-section that were machined somewhat tangentially through the arc chamber walls. One example of such a device consisted of the use of a single tangential slit in an alumina tube.

While the prior art includes examples of the use of holes within an arc chamber to facilitate injection of gas, Applicants are unaware of any device wherein care was taken to specifically design the spacing between holes, the number of holes around the circumference, and the particular hole configuration to particularly enhance device performance. In the prior art, in arc chamber wall designs as described above consisting of alternating rings of insulative material and conductive material, typically, one, two or more holes were provided equally circumferentially spaced in a common plane in each insulator ring. In such designs, the spacing between adjacent insulators, I, was of the same order of magnitude as the diameter, D, of the arc chamber. In the prior art, a typical range of values for the ratio I/D was 0.3 to 1.5. Since the axial distance between adjacent rings of injection holes was typically the same as the spacing of adjacent insulative rings, the axial hole spacing would also be in the range of 0.3 to 1.5 times the bore diameter. Sometimes, injection holes were drilled only in every two or more rings thereby at least doubling the I/D ratio.

Given the large spacing between adjacent rows of holes, in order to avoid excessive pressure drops into the arc chamber, injection hole diameter was typically made relatively large. Typical values for a 30 kilowatt, 75 kilojoule/gram arc jet were 8 insulative rings, each of which having a bore diameter of 0.75 inches, each of which having an axial length of 0.5 inches, each containing two opposed injection holes each of 0.050 inches diameter. Based upon the above discussion, the spacing between adjacent injection holes, presuming that the conductive rings have the same axial length as the insulative rings, was at least 1 inch where injection holes were provided in each insulative ring and 2 inches where every other insulative ring was provided with injection holes. In the context of the dimensions described above, these values are quite high.

More importantly, the spacing of the rows of injection holes was provided based upon the structural convenience of the existence of the insulative holes, rather than based upon a determination of the optimal hole configuration. One basis for the present invention is to provide arc chamber configuration and injection hole configuration pursuant to optimization of design characteristics for enhanced performance.

SUMMARY OF THE INVENTION

The present invention relates to a radiation and regeneratively cooled arc jet device which is useful, among other purposes, for thin diamond film deposition, and includes improvements to facilitate higher gas enthalpy operation. The present invention includes the following interrelated objects, aspects and features:

1. In a first aspect, the present invention contemplates the use of a cylindrical arc chamber having a first end closed by an insulator carrying a cathode and a second open end carrying a ring-shaped anode. Upstream of the anode, an insulative disc made of a material such as pyrolytic Boron Nitride is employed due to its high thermal shock parameter that limits the possibility of mechanical failure at the high thermal loading of the inventive device.

2. Between the cathode and anode, the cylindrical chamber walls are made of a high thermal shock parameter material such as a molybdenum alloy known as TZM which has a thermal shock value of 265 at 1000° C.

3. A multiplicity of equally circumferentially spaced rows of injection holes are provided within the chamber walls. The axial spacing, s, of these adjacent injection holes in each row is made small relative to the chamber diameter, D, in a ratio of on the order of 1:10 to 1:30, or greater.

4. The diameter of each injection hole is made relatively small in order to provide a relatively high injection velocity of gas tangentially into the chamber. In the preferred embodiment, the diameter, d, of each injection hole is in the range of 0.020 to 0.025 inches. The axial spacing, s, between adjacent holes in one row is preferably set to provide a ratio between the axial spacing and hole diameter (s:d) within the range of 2:1 to 5:1. Thus, with a hole diameter, d, of 0.020 to 0.025 inches, the axial spacing, s, between adjacent holes in one row is set within the range of 0.04 to 0.125 inches. With an arc chamber diameter, D, of about 1.5 inches, the ratio between the axial spacing, s, of holes and the arc chamber diameter, D, (s:D) would be on the order of 1:10 to 1:40 compared to the typical prior art ratio of 0.3 to 1.5.

5. The length of the arc chamber, L, is greater than the diameter of the arc chamber, D. The preferred ratio of, L/D, is greater than 2:1, but less than 12:1.

This range of L/D ratios particularly sets the claimed invention apart from two extremes of the prior art. Specifically, it distinguishes the claimed invention from the typical low impedance (less than one Ohm) devices which operate at relatively high current and low voltage, having an L/D ratio typically less than 1. The second extreme design of the prior art, which is commonly called a Constricted Arc Heater, typically has a high L/D ratio of greater than 12:1, up to 100:1 and utilizes a stack of alternating insulative and conductive rings to provide a channel which stabilizes the arc discharge by the proximity of the cooled walls and gas bleed between segments.

Accordingly, it is a first object of the present invention to provide a radiation and regeneratively cooled arc jet device for thin diamond film deposition that facilitates higher gas enthalpy operation at higher thermal efficiency (greater than 90%) than is known in the prior art.

It is a further object of the present invention to provide such a device wherein spacing of adjacent injection holes is set as compared to chamber diameter to enhance operation by creation of a uniform, nearly continuous sheet of vortex gas into the chamber.

It is a still further object of the present invention to provide such a device wherein materials having high thermal shock parameter are employed to reduce the possibility of thermally-induced mechanical failure.

It is a still further object of the present invention to provide such a device wherein injection hole diameter is calculated based upon the anticipated desired mass flow rate and injection velocity of gas.

It is a still further object of the present invention to provide such a device wherein the ratio of arc voltage to arc current is greater than two, but less than twenty which provides benefits that are discussed herein.

These and other objects, aspects and features of the present invention will be better understood from the following detailed description of the preferred embodiment when read in conjunction with the appended drawing figures.

BRIEF DESCRIPTION OF THE DRAWINGS

FIG. 3 shows a cross-sectional view along the line III—III of FIG. 2.

FIG. 4 shows a cross-sectional view similar to that of FIG. 3 but showing an alternative configuration of injection holes.

FIG. 6 shows an enlarged schematic representation of small injection hole spacing.

FIG. 7 shows an enlarged schematic representation of large injection hole spacing such as found in the prior art.

SPECIFIC DESCRIPTION OF THE PREFERRED EMBODIMENT

Figure 1:
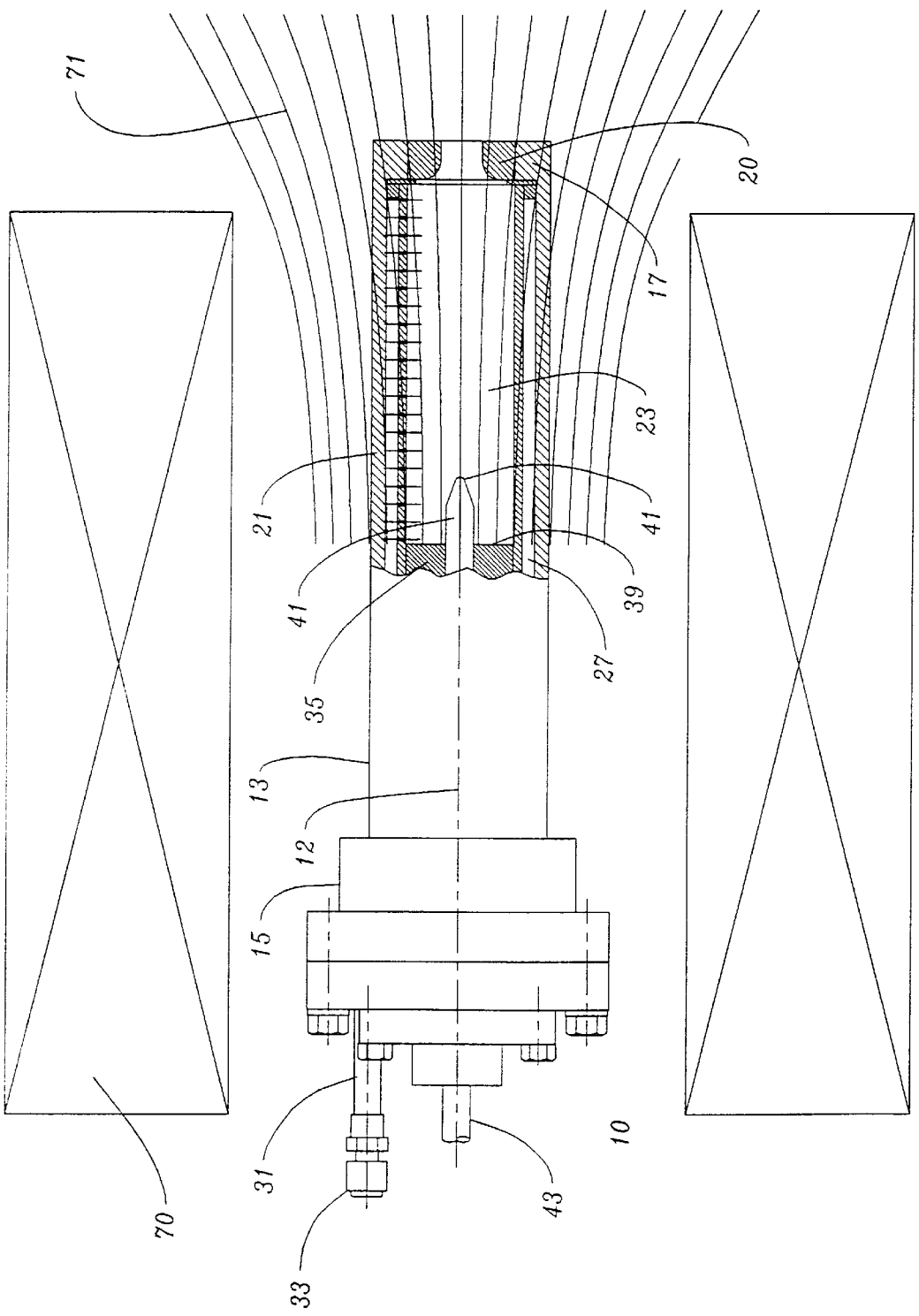
FIG. 1 shows a longitudinal cross-sectional view of the present invention.

With reference, first, to FIG. 1, the inventive device is generally designed by the reference numeral, 10, and includes an external cylindrical shell, 13, connected to a proximal fitting, 15. In the preferred embodiment of the present invention, the cylindrical shell, 13, is made of a material such as a molybdenum alloy known as TZM. A distal fitting, 17, separates the cylindrical shell, 13, from the anode, 20, that consists of ring-like structure as shown. In the preferred embodiment of the present invention, the anode, 20, is made of a material such as 2% Th—W or Lanthanum-doped Tungsten.

The proximal fitting, 15, receives therethrough a tube, 21, having an inner wall, defining an arc chamber, 23, an outer wall slightly inwardly spaced from the inner walls of the cylindrical shell, 13, and an annular chamber, 27, therebetween coupled to a source of gas (not shown) via a passageway, 31, and a coupler, 33.

The fitting, 15, includes an internal insulative portion, 35, that extends distally into the arc chamber, 23, which portion, 35, has a central passageway, 37, sized to receive therethrough the cathode, 40, that extends distally of a termination wall, 39, of the insulative portion, 35, and includes a conical distal end, 41.

In the preferred embodiment of the present invention, the cathode, 40, is made of a material such as 2% Th—W or lanthanum-doped tungsten. The proximal end, 43, of the cathode, 40, is connectable to the negative terminal of a source of direct current as is the anode, 20, connected to the positive terminal of a source of direct current, so that, at sufficient power levels, an arc can be formed within the arc chamber, 23, between the conical distal end, 41, of the cathode, 40, and the anode, 20.

Also shown in FIG. 1 is an electromagnetic solenoid, 70, that extends nearly over the length of the housing, 13. Reference numeral, 71, refers to magnetic field lines of equal potential.

Figure 2:
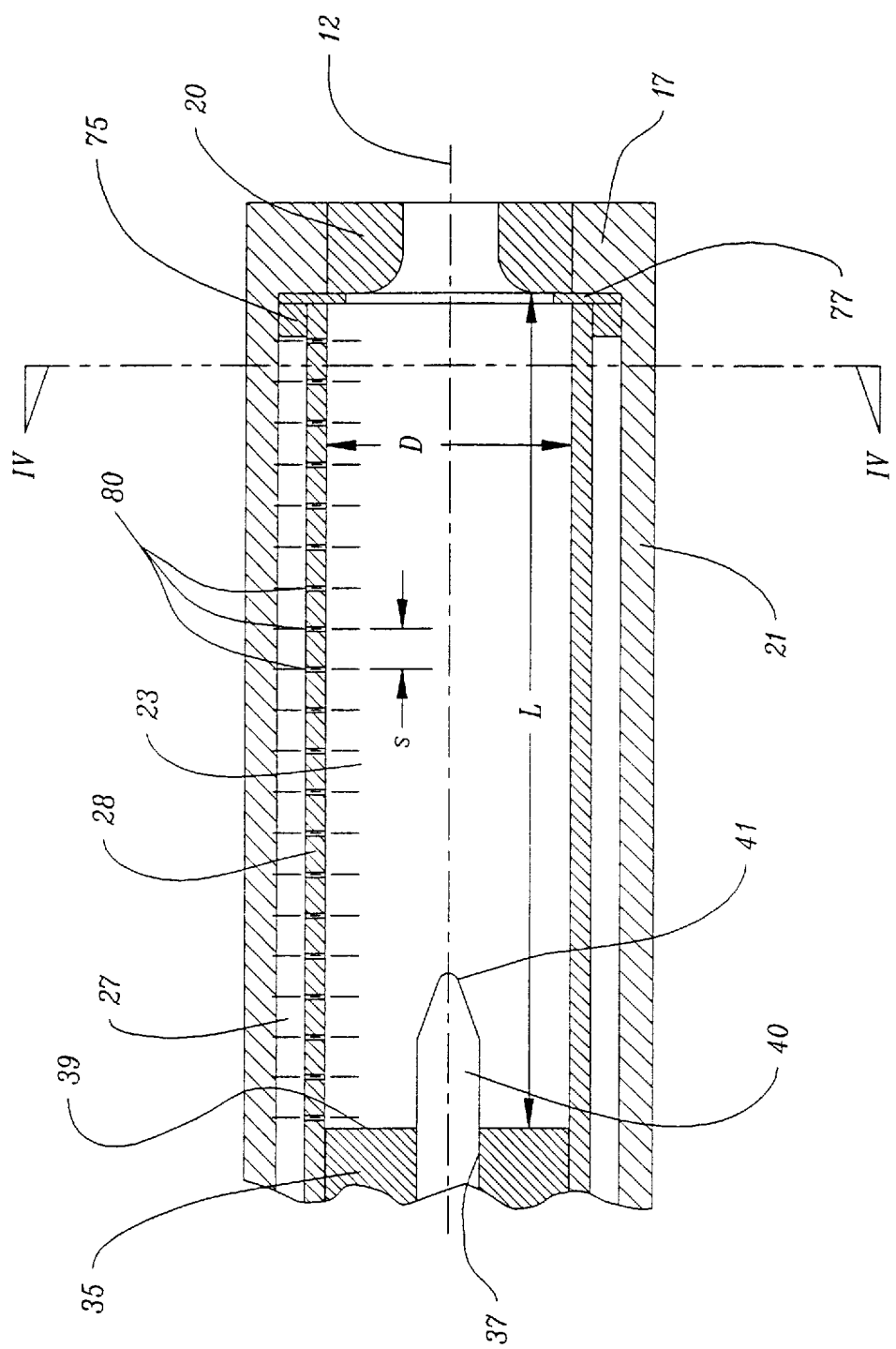
FIG. 2 shows a longitudinal cross-sectional view of the present invention along the same plane as that of FIG. 1 but enlarged to show detail.

With reference to FIG. 2, further details of the inventive device, 10, are evident. In particular, interposed between the tube, 21, and the fitting, 17, is a centering insulator, 75, as well as an anode end insulator disc, 77, preferably made of a material such as a pyrolytic grade of Boron Nitride. This material is chosen for reasons to be described in greater detail hereinafter.

Also shown in FIG. 2 are a multiplicity of small holes, 80, seen to be extending through the wall, 28, of the tube, 21. This illustrates the spacing, s, between holes in each longitudinal row. This figure also illustrates the arc chamber diameter, D, and length, L.

Figure 5:
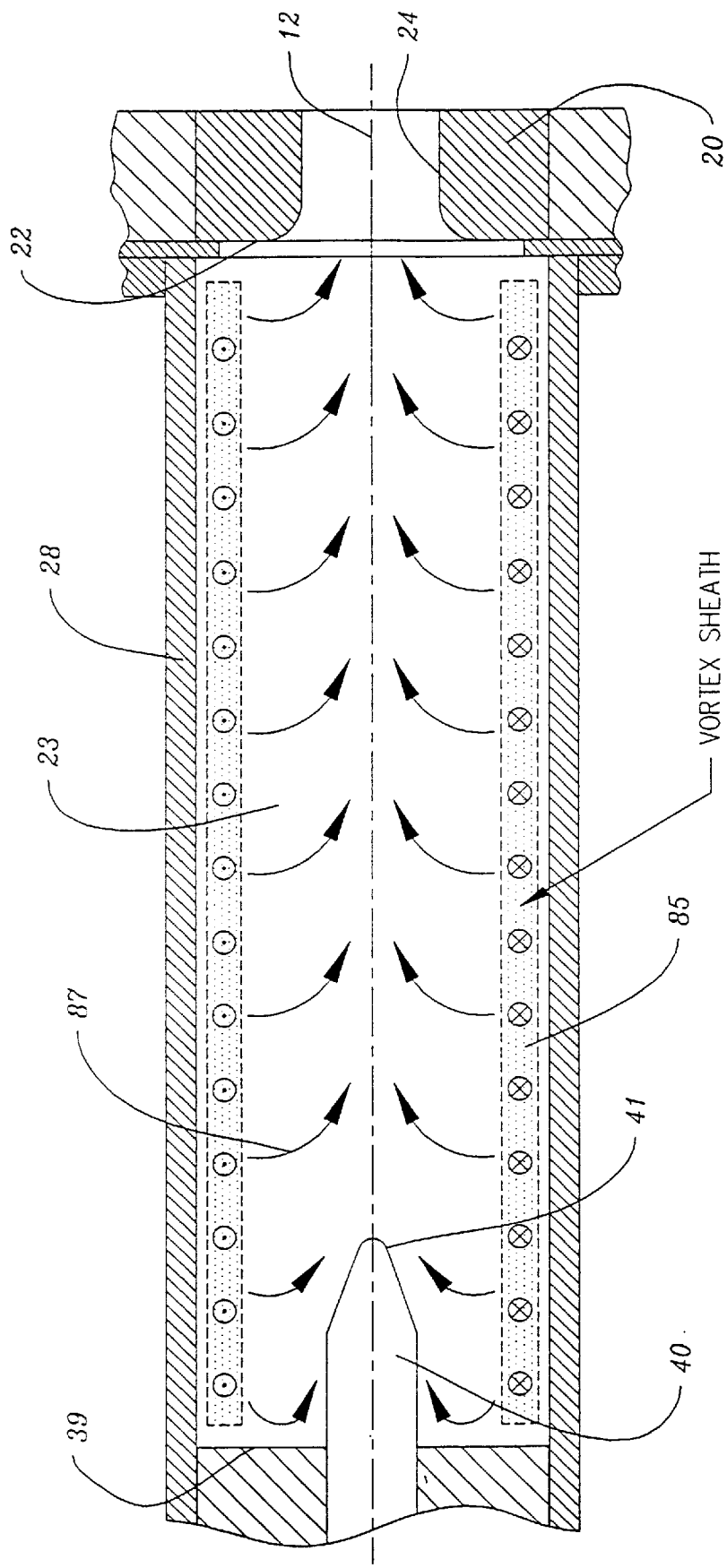
FIG. 5 shows a longitudinal cross-sectional schematic view of the present invention showing gas vortex details.

FIG. 3 shows a cross-sectional view along the line III—III of FIG. 2 and shows holes, 80, wherein two diametrically opposite rows are formed to extend tangentially through the wall portion, 28, of the tube, 21, and extending in opposite directions as shown in FIG. 3 so that gas supplied (FIG. 1) at the coupler, 33, and flowing through the passageway, 31, into the chamber, 29, into the chamber, 27, through the injection holes, 80, and into the arc chamber, 23, will form a vortex sheath, 85, clearly seen with reference to FIG. 5. In the preferred embodiment of the present invention, the gas to be injected consists of hydrogen or a hydrogen/hydrocarbon mixture. Given the closed end of the chamber, 23, formed by the wall, 39, and the open end of the chamber formed by the orifice, 24, through the anode, 20, the flow of gas out the chamber, 23, is generally in the direction of the arrows, 87, shown in FIG. 5.

FIG. 4 shows an alternative construction wherein four holes, 80, are provided at each row spaced equidistantly 90° apart.

With structural details of FIGS. 1–5 having been described, various features and parameters comprising the essence of the present invention will now be described in detail. As explained above, an electric arc discharge is initiated by application of a DC power supply between the conical distal end, 41, of the cathode, 40, and the ring-like anode, 20. The formed electric arc is acted upon by a Lorentz force due to the current of the arc and the magnetic field applied by virtue of activation of the electromagnets, 70. Accordingly, the path of the arc takes a helical shape and the vortex flow of the injected gas, best illustrated in FIG. 5, provides a pressure gradient within the cross-sectional plane of the arc chamber, 23. This pressure gradient stabilizes the arc by providing an inward radial force component which opposes the outward radial force component of the Lorentz force. The arc pressure is less than the gas pressure such that the pressure gradient provides this opposing force as a "buoyant" force.

The tangential component of the Lorentz force rotates the arc path relative to the gas flow pattern about the centerline, 12, of the arc chamber, 23. This rotation of the arc within the gas stream facilitates mixing between the relatively cold gas and the relatively hot arc. Interaction between the arc and the gas provides an energy exchange which results in heating and dissociation of the hydrogen or hydrogen/hydrocarbon gas mixture. This hot and dissociated gas stream is moved radially inwardly toward the chamber centerline, 12, by centrifugal and pressure gradient forces and then is ejected through the exit orifice, 24, and toward a mandrel (not shown) for thin film deposition.

One major goal of the present invention is to facilitate higher gas enthalpy operation which is desirable for enhancement of diamond film quality. The primary limiting factor to high enthalpy operation in a radiation cooled arc jet device is the heat exchange between the heated gas and the arc chamber confining walls. As explained above, known prior art contemplated a chamber cylindrical wall made of alumina or other ceramic material and with a single tangential slit to inject hydrogen gas or a gas mixture. Such tubes were prone to fracture due to excessive thermal stress from the heat loading during higher gas enthalpy operation. The single slit also had an asymmetrical force which caused a vortex flow that was not circular nor concentric with the chamber centerline. This phenomenon caused uneven heating at the alumina tube, producing "local hot zones". The present invention addresses the thermal stress problem associated with the high heat loading and the symmetry issue concerning gas injection. The amount of heat a material can conduct safely without mechanical failure can be represented by a so-called "thermal shock parameter". The thermal shock parameter (T.S.P.) is expressed by the following equation:

$$T.S.P. = \frac{K\sigma(1-\upsilon)}{Ea} \, [W/cm]$$

K=Thermal Conductivity(W/cm/K)
σ=Tensile Strength(Mpa)
E=Young's Modulus(Gpa)
a=Coefficient of Thermal Expansion($10^{-6}$/K)

Applicants have performed experiments to determine the minimum desirable T.S.P. value. In this regard, Applicants have found that an arc chamber liner having a T.S.P. of 5 W/cm such as is the case for the material alumina, would fracture with an average gas enthalpy of 85 kJ/g. The present invention contemplates a desired gas enthalpy of greater than 90 kJ/g and preferably in the range of 125 kJ/g which would require, at minimum, a liner material having a T.S.P. of at least 7.5 W/cm. Including a small safety factor above that T.S.P. level results in the requirement of a specified minimum T.S.P. of 10 W/cm.

For alumina at 1000° C. (typical operating temperature), the T.S.P.=5. The present invention contemplates a material with a T.S.P. much greater than 5 at 1000° C. for the outer cylindrical shell, 13, and the tube, 21. In particular, such a material is TZM, a molybdenum alloy, which has a T.S.P. value of 265 at 1000° C. The gas injection symmetry is addressed, as explained above, by the introduction of two axially directed rows of many holes with tangential entry angles that are 180° apart. Alternatively, three rows of holes at 120°, four rows of holes at 90° (FIG. 4), and so forth, could be provided where the number of rows is more than one and azimuthal symmetry is maintained. Considering the high voltage between the ring anode, 20, and the cathode tip, 40, the chamber wall, 23, must be electrically insulated from the electrodes. The cathode end had relatively less heat load, so alumina suffices as the insulative material for the fitting, 35. The anode end, however, has much higher heat load so its insulator must have a high T.S.P. value. The invention contemplates a pyrolytic boron nitride insulator, 77, that has a T.S.P. greater than 30,000 at 1000° C. The erosion characteristics of standard grade boron nitride such as used in the prior art prevents it from being used along the arc chamber walls. The pyrolytic grade of boron nitride has been found by Applicants to exhibit excellent erosion resistance.

One example of this invention which is designed to operate at 50 kW has an arc chamber length of about 5 inches and a distance slightly less between the electrodes, with a chamber diameter between 1 and 2 inches. This design configuration fosters a higher impedance arc such that a smaller current is needed for high Ohmic power. Lower currents help prevent the sputtering of the electrodes which in turn provides for longer device lifetime and for fewer contaminated film specimens.

Based upon the above description, which includes the use of small diameter, closely spaced injection holes, 80, the invention achieves a uniformity of injection velocity and vorticity along the length of the arc chamber, 23, as shown with reference to FIGS. 5 and 6 while avoiding structural and thermal expansion problems that are associated with prior art slit-type orifice configurations. With reference to FIG. 7, if, to the contrary, the injection holes are too large and/or are spaced too far apart, a uniform sheet-like gas pattern such as illustrated in FIGS. 5 and 6 will not occur. Instead, the flow will consist of several tangential jets with non-uniform flows between which will arise dead regions or reverse flow patterns such as are illustrated in FIG. 7. Such dead regions and reverse flow patterns contribute to arc instability, extraordinary wall heating, and lower efficiency of the electrical-to-gas energy transfer. The teachings of the present invention avoid the problems illustrated in FIG. 7.

The diameter of each injection hole is made relatively small, due to the close spacing of adjacent rows of holes that would tend to reduce pressure drops. In one preferred embodiment, the diameter, d, (FIG. 6) of each injection hole is in the range of 0.020 to 0.025 inches. The axial spacing, s, (FIG. 6) between adjacent holes is preferably set to provide a ratio between the axial spacing and hole diameter, (s:d) of 2:1 to 5:1. Thus, with hole diameter, d, of 0.020 to 0.025 inches, the axial spacing, s, between adjacent rows of holes is set within the range of 0.040 to 0.125 inches. With an arc chamber diameter, D, (FIG. 3) of about 1.5 inches, the ratio between the axial spacing, s, of holes and the arc chamber diameter, D (s:D) is 1:15 as compared to the typical prior art ratio of 0.3 to 1.5.

In creating the relationship between injection orifice area and spacing, detailed experimentation was conducted. Due to the complex gas dynamic and magnetohydrodynamic phenomena that occur in the arc chamber, the experimental method is preferred over an analytical method for calculating the optimum ratio of the spacing between adjacent injection holes versus the chamber diameter. The optimum value, determined experimentally, is in the range of 1:15. A desirable range of ratios would be 1:5 up to 1:50 or larger. The largest possible ratio would enhance vortex smoothness but there is a practical fabrication limitation concerning the minimum spacing between adjacent injection holes, 80, and the hole diameter, S, which must be decreased as the spacing is decreased. Accordingly, the optimal range comprises 1:10 to 1:30. The exit orifice area, a, is calculated to provide a stable arc chamber pressure for a selected value of gas flow which is derived from the desired power and gas enthalpy levels. The arc chamber cross-sectional area, A, derived from the arc chamber diameter is chosen based upon desired power and enthalpy levels for the desired arc impedance.

In the preferred embodiment of the present invention, the arc impedance should fall within the range of 2 to 20 Ohms. This range comprises a compromise between the best theoretical performance and pragmatic limitations. Low impedance arc discharges, typically less than 1 Ohm, run at relatively high currents at low voltages. For example, a 50 kW low impedance arc might operate at 100 volts and 500 amps. Under those circumstances, the impedance would be V/A or 100/500 or 0.2 Ohms. An example of a preferred specification for the inventive arc would include operation at 500 volts and 100 amps with a corresponding impedance of 5 Ohms. The advantages of higher impedance operation include the following:

1. Less electrode erosion due to less Ohmic $I^2R$ heating which means longer electrode life and less contamination of the deposited film;
2. Lower currents require smaller conductors, cables and electrodes and thereby create facility hardware savings;
3. Smaller transformer, choke and diode sizes create less expensive arc power supplies;
4. These aspects result in lower thermal losses from the arc column to the chamber walls, electrodes and insulators due to the lower, less intense current discharge. Where high current, low impedance arcs are employed, high radiation losses are exhibited and the electrodes are typically cooled by a heat exchange fluid such as water to prevent "melt-down". High thermal losses result and thereby lower device efficiency is obtained. In the inventive device, the high impedance arc only requires radiative and regenerative gas cooling and, thus, results in higher thermal efficiency.

On the other extreme, where the arc device is designed for very high impedance operation, for example, 100 Ohms, the device specifications would require an exception voltage of over 2200 volts and a modest current of only 22 amps. Such high voltage would necessitate more electrical insulation to prevent spurious breakdown, with increased power supply costs for the high voltage diodes, and a longer arc chamber to handle the longer arc length associated with higher voltage operation. Thus, as a compromise, the present invention contemplates an optimal range for the impedance of from 2 Ohms up to about 20 Ohms.

As explained above, during the initial transient thermal conditions of start-up and later during continuous equilibrium operation, the electrodes and chamber walls receive heat via both radiation from the arc and convection from the heated gas. In the present invention, the high impedance arc is less intense from a radiation standpoint than the prior art and the vortex chamber design, as described above, minimizes hot gas convection directly to the chamber walls. The power that is radiated from the arc to the arc chamber walls is mostly returned to the gas within the chamber by incoming cooler gas. This "regenerative cooling" keeps the middle and rear sections of the arc device at a moderate temperature without much loss of energy to ambient. At the distal end of the chamber, adjacent the anode, elevated temperatures are exhibited due to the arc attachment to the anode, and convected and radiated heat is transferred from the hot gas as it passes through the anode exit orifice, 24, the downstream injector and the nozzle. These components are appropriately designed and situated such that the collected energy can be radiated out to the cooled electromagnet housing and vacuum chamber walls. Given the design of the present invention, no additional direct fluid cooling of the inventive device, 10, is required.

In summary, in the preferred embodiment of the present invention, the following characteristics are incorporated:

1. The walls of the arc chamber, 23, are preferably made of a material having a T.S.P. greater than 10 W/cm;
2. At least two azimuthally symmetrical rows of gas injection holes, 80, are provided with equal aximuthal spacing between adjacent rows;
3. The ratio of the spacing of injection holes to the chamber diameter, s:D, is on the order of 1:10 to 1:30 or greater;
4. The length of the arc chamber, L, is greater than the diameter of the arc chamber, D;
5. The gap between the cathode and anode is slightly less than the length of the arc chamber;
6. The impedance of the arc at operating conditions is relatively high, within the range of 2 Ohms to 20 Ohms.

The following characteristics are expected in a device having the characteristics described above:

1. Relatively low centerline gas temperature of exiting gas jet;
2. High efficiency (greater than 90%) of conversion of electrical input power into gas thermal energy;
3. Helical arc path stabilized by Lorentz force and gas vortex buoyancy force;
4. Nearly uniform magnetic field produced by elongated solenoid with small divergence of magnetic potential field lines from cathode to anode axial positions;
5. Large jet diameter due to large exit orifice diameter. The ratio of exit orifice cross-sectional area, a, to arc chamber cross-sectional area, A (a:A), would be in the range of 1:15 to 1:3;
6. Uniform mixing between cold chamber gas and arc;
7. Gas jet with radially-uniform temperature, species, and velocity profiles;
8. Liner 21 is regeneratively cooled by the influx of cold primary gas prior to injection into the arc chamber influx, without the use of water-cooling that would consume power and lower the overall efficiency;
9. All arc jet device components are cooled by radiation and primary gas influx, without the use of water-cooling which would consume power and lower the overall efficiency.

Accordingly, an invention has been disclosed in terms of a preferred embodiment thereof which fulfills each and every one of the objects of the invention as set forth hereinabove and provides a new and useful radiation and regeneratively cooled arc jet device for thin diamond film deposition facilitating higher gas enthalpy operation of great novelty and utility.

Of course, various changes, modifications and alterations in the teachings of the present invention may be contemplated by those skilled in the art without departing from the intended spirit and scope thereof.

As such, it is intended that the present invention only be limited by the terms of the appended claims.

We claim:

1. A radiation and regeneratively cooled arc jet device for thin film diamond deposition, comprising:
   a) a generally cylindrical arc chamber having a length, L, extending about a central axis of elongation, said chamber having a diameter, D, defining a cross-sectional area, A, and having a closed proximal end and an open distal end, a ratio of L:D being in the range of 2:1 to 12:1;
   b) a cathode mounted on said proximal end aligned with said axis and extending toward said distal end;
   c) a ring-shaped anode mounted on said distal end about said axis and having an opening aligned about said axis and defining an area, a;
   d) a plurality of rows of gas injection holes extending through walls of said chamber and fluidly connectable with a source of gas, each hole having a diameter, d, and opening tangentially into said chamber, each row of holes having a plurality of holes equidistantly spaced about a circumference of said chamber, adjacent holes in a row being spaced apart by a distance, s;

e) a ratio s:d being in the range of 2:1 to 5:1;

f) a ratio s:D being in the range of 1:10 to 1:30;

g) a ratio a:A being in the range of 1:15 to 1:3;

h) whereby high gas enthalpy operation greater than 90 kJ/g is achieved.

2. The device of claim 1, wherein said cathode has a generally conical tip.

3. The device of claim 2, wherein said cathode is mounted in an insulative fitting.

4. The device of claim 3, wherein said fitting is made of alumina.

5. The device of claim 3, wherein said anode is isolated from said walls by an insulator disc.

6. The device of claim 1, wherein said anode is isolated from said walls by an insulator disc.

7. The device of claim 6, wherein said disc is made of a pyrolytic grade of boron nitride.

8. The device of claim 1, further including a source of magnetic field mounted in surrounding relation to said chamber.

9. The device of claim 8, wherein said source of magnetic field comprises an electromagnet.

10. The device of claim 1, wherein said holes communicate with an annular space within said chamber walls.

11. The device of claim 1, wherein the ratio of operating arc voltage to arc current is in the range of 2:1 to 20:1.

12. The device of claim 11, wherein said cathode is made of thoriated-tungsten or lanthanated-tungsten.

13. A radiation and regeneratively cooled arc jet device for thin film diamond deposition, comprising:

a) a generally cylindrical arc chamber having a length, L, extending about a central axis of elongation, said chamber having a diameter, D, defining a cross-sectional area, A, and having a closed proximal end and an open distal end;

b) a cathode mounted on said proximal end aligned with said axis and extending toward said distal end;

c) a ring-shaped anode mounted on said distal end about said axis and having an opening aligned about said axis and defining an area, a;

d) a plurality of rows of gas injection holes extending through walls of said chamber and fluidly connectable with a source of gas, each hole having a diameter, d, and opening tangentially into said chamber, each row of holes having a plurality of holes equidistantly spaced about a circumference of said chamber, adjacent holes in each row being spaced apart by a distance, s;

e) said walls being made of a material having a thermal shock parameter of at least 10 W/cm;

f) whereby high gas enthalpy operation greater than 90 kJ/g is achievable.

14. The device of claim 13, wherein said wall material is an alloy of molybdenum known as TZM.

15. The device of claim 13, wherein said cathode is mounted in an insulative fitting.

16. The device of claim 15, wherein said fitting is made of alumina.

17. The device of claim 13, wherein said anode is isolated from said walls by an insulator disc having a thermal shock parameter greater than 10 W/cm.

18. The device of claim 17, wherein said disc is made of a pyrolytic grade of boron nitride.

19. The device of claim 18, said disc having a thermal shock parameter greater than 200 W/cm.

20. The device of claim 13, wherein said anode is made of thoriated-tungsten or lanthanated-tungsten.

21. The device of claim 19, wherein said cathode is made of thoriated-tungsten or lanthanated-tungsten.

22. The device of claim 13, wherein the ratio of operating arc voltage to arc current is 2:1 to 20:1.

23. The device of claim 13, maintained at an appropriate operating temperature by radiation and regenerative cooling by influx of primary gas, without use of forced liquid-cooling.

* * * * *